(12) United States Patent
Srivastava et al.

(10) Patent No.: US 12,287,658 B2
(45) Date of Patent: Apr. 29, 2025

(54) POWER SUPPLIES AND IMPROVED SIGNAL ADJUSTMENT

(71) Applicant: Infineon Technologies Austria AG

(72) Inventors: Aviral Srivastava, Los Angeles, CA (US); Luca Petruzzi, Andover, MA (US); Benjamim Tang, Rancho Palos Verdes, CA (US)

(73) Assignee: Infineon Technologies Austria AG, Villach (AT)

( * ) Notice: Subject to any disclaimer, the term of this patent is extended or adjusted under 35 U.S.C. 154(b) by 261 days.

(21) Appl. No.: 17/954,589

(22) Filed: Sep. 28, 2022

(65) Prior Publication Data
US 2024/0103552 A1 Mar. 28, 2024

(51) Int. Cl.
*G05F 1/575* (2006.01)
*G05F 1/46* (2006.01)

(52) U.S. Cl.
CPC .............. *G05F 1/575* (2013.01); *G05F 1/468* (2013.01)

(58) Field of Classification Search
CPC ...... G05F 1/575; G05F 1/468; H02M 1/0025; H03M 1/1028
See application file for complete search history.

(56) References Cited

U.S. PATENT DOCUMENTS

| 2010/0188062 | A1* | 7/2010 | Candage | H02M 3/1588 323/271 |
| 2012/0212193 | A1* | 8/2012 | Sreenivas | H02M 3/1588 323/234 |
| 2016/0282889 | A1* | 9/2016 | Mahajan | G05F 1/575 |
| 2018/0292851 | A1 | 10/2018 | Mahajan et al. | |
| 2024/0103553 | A1* | 3/2024 | Sen | H02M 1/0025 |

OTHER PUBLICATIONS

Extended European Search Report, EP 23 19 9785, Mar. 7, 2024, pp. 1-10.

* cited by examiner

*Primary Examiner* — Kyle J Moody
(74) *Attorney, Agent, or Firm* — Armis IP Law, LLC

(57) ABSTRACT

A signal adjustor receives a first signal such as feedback associated with generation of an output voltage. The output voltage is regulated based on a selected setpoint reference voltage. The signal adjustor maps a magnitude of the selected setpoint reference voltage to a first set of signal adjustment information amongst multiple sets of signal adjustment information. The signal adjustor then applies the first signal adjustment information to the first signal to produce a second signal.

30 Claims, 13 Drawing Sheets

POWER SUPPLIES AND IMPROVED SIGNAL ADJUSTMENT

BACKGROUND

One type of conventional power converter is a voltage regulator. In general, to maintain an output voltage within a desired range, a controller in the voltage regulator compares the magnitude of a generated output voltage to a setpoint reference voltage. Based on a respective error voltage derived from the comparison, the controller modifies a respective switching frequency and/or pulse width modulation associated with activating high side switch circuitry and low side switch circuitry in the voltage regulator.

Typically, a power supply controller regulates a respective output voltage of a power supply based on a desired setpoint reference voltage. Conventional power converters can be configured to receive a voltage value (such as a so-called VID value) indicating a desired output voltage setting. The VID voltage value may vary over time depending on system operation. The conventional voltage regulator uses the VID value as the setpoint reference voltage. Accordingly, a device generating the VID value is able to control a magnitude of the output voltage.

Conventional control techniques can be configured to implement techniques such as i) device matching and optimal layout technique to achieve minimal drift; and ii) Offset trimmed at one setpoint voltage; Gain trimmed at two setpoint voltages. However, such techniques typically are not able to meet the future requirements for reference voltage setpoint accuracy.

BRIEF DESCRIPTION

Implementation of clean energy (or green technology) is very important to reduce human impact on the environment. In general, clean energy includes any evolving methods and materials to reduce an overall toxicity on the environment from energy consumption.

This disclosure includes the observation that raw energy, such as received from green energy sources or non-green energy sources, typically needs to be converted into an appropriate form (such as desired AC voltage, DC voltage, etc.) before it can be used to power end devices such as servers, computers, mobile communication devices, wireless base stations, etc. In certain instances, energy is stored in a respective one or more battery resource. Alternatively, energy is received from a voltage generator or voltage source.

Regardless of whether energy is received from green energy sources or non-green energy sources, it is desirable to make most efficient use of raw energy (such as storage and subsequent distribution) provided by such sources to reduce our impact on the environment. This disclosure contributes to reducing our carbon footprint and providing better use of energy via more efficient energy conversion.

This disclosure further includes the observation that conventional implementation of setpoint reference voltage generators and trimming suffer from deficiencies. In contrast to conventional techniques, to improve initial set point accuracy for VR controllers as discussed herein, a signal adjustor trims gain error and offset error via multiple trim points for different ranges of a feedback signal. For example, a first set of trim settings improves accuracy in the higher input voltage range (~0.8-3 V) and a new low range trim is targeted to improve accuracy in the lower voltage range (~0.25-0.8 V).

Trim values can be calculated based on preset voltage ranges at ATE (Automatic Test Equipment) and stored in registers (i.e., buffer storing adjustment information). A comparator or other suitable entity may switch between using default or low range trim values versus high range trim values based on the VID (selected target setpoint reference voltage) dynamically set by customer operating the power converter circuit.

More specifically, an apparatus as discussed herein includes a signal adjustor. The signal adjustor receives a first signal. The first signal may be feedback associated with generation of an output voltage. The output voltage is regulated based on a selected setpoint reference voltage. The signal adjustor receives the selected setpoint reference voltage and maps a magnitude of the selected setpoint reference voltage to a first set of signal adjustment information amongst multiple sets of signal adjustment information. The signal adjustor then applies the first signal adjustment information to the first signal to produce a second signal.

The second signal may be an error corrected rendition of the first signal.

The multiple sets of signal adjustment information can be generated in any suitable manner. For example, each of the multiple sets of signal adjustment information may be derived during calibration of an analog-to-digital converter operative to produce the first signal.

The first signal may be received from any suitable entity. For example, the first signal may be received from an analog-to-digital converter disposed in a feedback path of a power converter operative to generate the output voltage. The analog-to-digital converter can be configured to include an error sense tracking and compensation loop operative to generate the first signal based on a magnitude of the output voltage.

Yet further, the apparatus as discussed herein can be configured to include an error signal generator operative to receive the setpoint reference voltage and the second signal. The error signal generator generates an error signal based on a difference between the second signal and the selected setpoint reference voltage.

The signal adjustor may apply different adjustment values to the received first signal at different times depending on a magnitude of the selected setpoint reference voltage.

For example, for a first instant or duration of time, assume that the signal adjustor determines a first voltage range amongst multiple voltage ranges in which the magnitude of a first instance of the selected setpoint reference voltage falls. A first set of signal adjustment information is assigned to the first voltage range. In such an instance, to provide appropriate error correction to the first signal (and corresponding analog-to-digital converter generating the first signal), the signal adjustor applies the first signal adjustment information to the first signal to produce the second signal. The first signal adjustment information includes any suitable information such as a first gain adjustment value and a first offset adjustment value. The adjustor is operative to apply the first gain adjustment value and the first offset adjustment value to the first signal to produce the second signal.

For a second instant or duration of time, assume that the signal adjustor determines a second voltage range amongst multiple voltage ranges in which the magnitude of a second instance of the selected setpoint reference voltage falls. A second set of signal adjustment information is assigned to the second voltage range. In such an instance, to provide error correction to the second signal (and corresponding analog-to-digital converter generating the first signal), the signal adjustor applies the second signal adjustment information to the first signal to produce the second signal. In this manner, the signal adjustor dynamically selects a set of corresponding signal adjustment information to the received first signal depending on a magnitude of the setpoint reference voltage. The second signal adjustment information includes any suitable information such as a second gain adjustment value and a second offset adjustment value. The adjustor is operative to apply the second gain adjustment value and the second offset adjustment value to the first signal to produce the second signal.

Thus, each of the multiple sets of signal adjustment information may be assigned a respective voltage range associated with settings of the setpoint reference voltage. The respective voltage ranges may overlap with each other.

As previously discussed, the first signal can be received from any suitable entity. For example, the first signal may be received from an analog-to-digital converter operative to convert the output voltage into the first signal. The first signal from the analog-to-digital converter is a digital value. The second signal is a digital value whose magnitude is substantially equal to a magnitude of the output voltage subsequent to application of the gain and offset adjustments.

The signal adjustment information can be generated in any suitable manner. For example, the signal adjustment information can be generated based on a slope of a first error signal analyzed during calibration of the analog-to-digital converter and signal adjustor. More specifically, the first signal adjustment information may include a first gain adjustment value derived from a first slope of the first error signal associated with a first operational range of the setpoint reference voltage as generated during calibration of the signal adjustor for the first voltage range. The second signal adjustment information may include a second gain adjustment value derived from a second slope of a second error signal associated with a second operational range of the setpoint reference voltage as generated during calibration of the signal adjustor for a second voltage range.

The first error signal associated with the first operational range may be linear or non-linear. The second error signal associated with the second operational range of the setpoint reference voltage may be linear or non-linear.

Yet further, the signal adjustor may be disposed in a circuit path between a digital-to-analog converter operative to produce the first signal and an error signal generator operative to receive the second signal.

This disclosure further includes a method comprising: receiving a first signal, the first signal being feedback associated with generation of an output voltage with respect to a selected setpoint reference voltage; mapping a magnitude of the selected setpoint reference voltage to a first set of signal adjustment information amongst multiple sets of signal adjustment information; and applying the first signal adjustment information to the first signal to produce a second signal. As previously discussed, the first signal may be received from an analog-to-digital converter disposed in a feedback path of a power converter, the power converter operative to generate the output voltage. An error sense tracking and compensation loop of the analog-to-digital converter can be configured to generate the first signal based on a magnitude of the output voltage.

Note that although the disclosure as discussed herein is applicable to power converters, the concepts disclosed herein may be advantageously applied to any other suitable topologies as well as general power supply control applications.

Note that any of the resources as discussed herein can include one or more computerized devices, mobile communication devices, servers, base stations, wireless communication equipment, communication management systems, workstations, user equipment, handheld or laptop computers, or the like to carry out and/or support any or all of the method operations disclosed herein. In other words, one or more computerized devices or processors can be programmed and/or configured to operate as explained herein to carry out the different techniques as described herein.

Yet other techniques herein include software programs to perform the steps and operations summarized above and disclosed in detail below. This disclosure includes a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, techniques herein are directed to methods, systems, computer program products, etc., that support operations as discussed herein.

The system as discussed herein may include a computer readable storage medium and/or system having instructions stored thereon. The instructions, when executed by computer processor hardware, cause the computer processor hardware (such as one or more co-located or disparately located processor devices) to: receive a control value indicative of a selected setpoint reference voltage; receive a first signal, the first signal being feedback associated with generation of an output voltage, the output voltage regulated based on a selected setpoint reference voltage; map a magnitude of the selected setpoint reference voltage to a first set of signal adjustment information amongst multiple sets of signal adjustment information; and apply the first signal adjustment information to the first signal to produce a second signal.

The ordering of the steps above has been added for clarity sake. Note that any of the processing steps as discussed herein can be performed in any suitable order.

Other techniques of the present disclosure include software programs and/or respective hardware to perform any of the method operations summarized above and disclosed in detail below.

It is to be understood that the system, method, apparatus, instructions on computer readable storage media, etc., as discussed herein also can be implemented strictly as a software program, firmware, as a hybrid of software, hardware and/or firmware, or as hardware alone such as within a processor (hardware or software), or within an operating system or a within a software application.

As discussed herein, techniques herein are well suited for use in the field of implementing one or more voltage converters to deliver current to a load. However, it should be noted that this disclosure is not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be implemented and viewed in many different ways.

Also, note that this preliminary discussion (BRIEF DESCRIPTION) purposefully does not specify every technique and/or incrementally novel aspect of the present disclosure or claimed invention(s). Instead, this brief description only presents general techniques and corresponding points of novelty over conventional techniques. For additional details and/or possible perspectives (permutations) of the invention(s), the reader is directed to the Detailed Description section (which is a further summary) and corresponding figures of the present disclosure as further discussed below.

Figure 1:
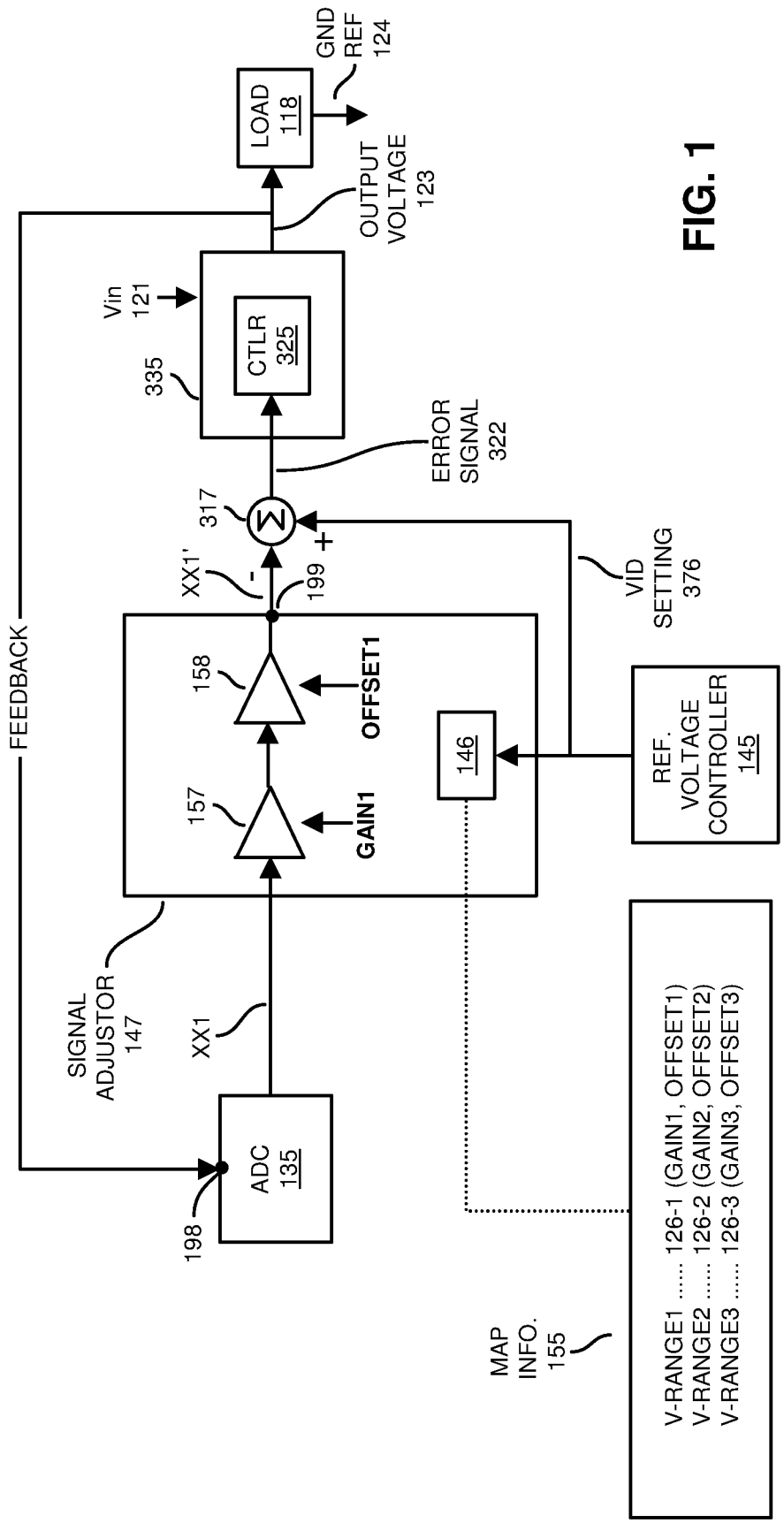
FIG. 1 is an example diagram illustrating adjustment of a received signal as discussed herein.

The foregoing and other objects, features, and advantages of the invention will be apparent from the following more particular description of preferred techniques herein, as illustrated in the accompanying drawings in which like reference characters refer to the same parts throughout the different views. The drawings are not necessarily to scale, with emphasis instead being placed upon illustrating the techniques, principles, concepts, etc.

DETAILED DESCRIPTION

A signal adjustor receives a first signal such as feedback associated with generation of an output voltage that powers a load. The output voltage is regulated based on a selected setpoint reference voltage such that the magnitude of the output voltage is substantially equal to the selected setpoint reference voltage. The signal adjustor maps a magnitude of the selected setpoint reference voltage to a first set of signal adjustment information amongst multiple sets of signal adjustment information. The signal adjustor then applies the first signal adjustment information to the first signal to produce a second signal (such as a corrected version of the first signal).

Now, more specifically, FIG. 1 is an example diagram illustrating signal adjustment as discussed herein.

As shown, the apparatus 100 such as a power supply or other suitable entity includes an analog-to-digital converter 135, signal adjustor 147, power converter 335 (such as a buck converter or other suitable entity), and a reference voltage controller 145. Signal adjuster 147 includes gain stage 157 (such as an amplifier and related circuitry) and offset stage 158 (such as an amplifier related circuitry). Signal adjustor 147 further includes controller 146.

In general, during run mode operation, the power converter 335 produces the respective output voltage 123 (such as an analog voltage) to power the corresponding load 118 referenced to the ground potential 124 (a.k.a., ground reference). Apparatus 100 includes a respective feedback path of the output voltage 123 (or output voltage feedback signal proportional to the output voltage 123) to the input node 198 of the analog-to-digital converter 135. As further discussed herein, if desired, the analog-to-digital converter 135 can be implemented as an error sense tracking and compensation loop 310 (see other FIGS.).

Referring again to FIG. 1, as its name suggest, the analog-to-digital converter 135 converts the received output voltage 123 (or derivative of the output voltage 123) into the signal XX1 supplied to the signal adjustor 147. As previously discussed, the output voltage 123 input to the analog-to-digital converter 135 is an analog signal. The signal XX1 outputted from the analog-to-digital converter 135 may be a digital signal.

The signal adjustor 147 receives the signal XX1 from an analog-to-digital converter 135 disposed in a feedback path (such as a feedback path from the output of the power converter 335, through analog-to-digital converter 135, and signal adjustor 147) to the input of the summer 317 (error voltage generator). The summer 317 produces the error signal 322 such as a difference between the VID setting 376 and the signal XX1'. The power converter 335 generates (regulates) the output voltage 123 based on the received error signal 322. The controller 325 of the power converter 335 produces the output voltage 123 such that the error signal 322 tends towards a value of zero corresponding to a condition in which the magnitude of the output voltage 123 is substantially equal to the VID setting 376.

As further shown, the gain stage 157 applies a respective GAINX to the received signal XX1 to produce the signal XX1'. The offset stage 157 applies a respective OFFSETX to the gain corrected signal XX1 outputted from the gain stage 157 to produce the signal XX1' outputted from the node 199 of the signal adjustor 147.

Note that the gain associated with the gain stage and the offset associated with the offset states can be generated in any suitable manner. For example, the reference voltage controller 145 outputs the selected VID setting 376 (which selects the magnitude of the output voltage 123) to the power converter 335. As previously discussed, the power converter 335 uses the received VID setting 376 (setpoint reference voltage) as a basis to regulate and produce the output voltage 123 from the input voltage 121. In other words, the power converter 335 produces the magnitude of the output voltage 123 to be equal to the VID setting 376. The reference voltage controller 145 dynamically changes the magnitude of the VID setting 376 to a desired value over time. The signal adjustor 147 applies different gain (GAINX) and offset (OFFSETX) values depending on a magnitude of the VID settings 376.

More specifically, as further shown, the reference voltage controller 146 receives the VID setting 376 and uses it as a basis in which to determine how to control settings of the GAINX associated with the gain stage 157 and the OFFSETX associated with the offset stage 158.

For example, at time T1, assume that the controller 146 detects that the VID setting 376 falls within a first voltage range V-RANGE1. In response to this condition, the controller 146 maps the VID setting 376 to signal adjustment information 126-1 such as value GAIN1 and value OFFSET1. In such an instance, the controller 146 of the signal adjustor 147 applies the gain value GAIN1 to the gain stage 157 and the offset value OFFSET1 to the offset stage 158. Thus, while the VID setting falls within range V-RANGE1, the signal adjustor 147 produces the signal XX1'= (XX1*GAIN1)+VOFFSET1.

As a further example, at time T2, assume that the controller 146 detects that the VID setting 376 falls within a second voltage range V-RANGE2. In response to this condition, the controller 146 maps the VID setting 376 to signal adjustment information 126-2 such as value GAIN2 and value OFFSET2. In such an instance, the controller 146 of the signal adjustor 147 applies the gain value GAIN2 to the gain stage 157 and the offset value OFFSET2 to the offset stage 158. Thus, while the VID setting falls within range V-RANGE2, the signal adjustor 147 produces the signal XX1'=(XX1*GAIN2)+VOFFSET2.

As a further example, at time T3, assume that the controller 146 detects that the VID setting 376 falls within a second voltage range V-RANGE3. In response to this condition, the controller 146 maps the VID setting 376 to signal adjustment information 126-3 such as value GAIN3 and value OFFSET3. In such an instance, the controller 146 of the signal adjustor 147 applies the gain value GAIN3 to the gain stage 157 and the offset value OFFSET3 to the offset stage 158. Thus, while the VID setting falls within range V-RANGE3, the signal adjustor 147 produces the signal XX1'=(XX1*GAIN3)+VOFFSET3. Thus, the signal adjustor 147 receives signal XX1. The signal XX1 may be feedback associated with generation of an output voltage 123 that is regulated based on a selected setpoint reference voltage (VID setting 376).

Accordingly, the controller 146 of the signal adjustor 147 maps a magnitude of the selected setpoint reference voltage (VID setting 376) to a first set of signal adjustment information 126-1 amongst multiple sets of signal adjustment information 126 (signal adjustor signal adjustment information 126-1, signal adjustment information 126-2, signal adjustment information 126-3, etc.). The signal adjustor 147 applies the selected signal adjustment information to the signal XX1 to produce a second signal XX1'. As previously discussed, the signal XX1' is an error corrected rendition of the signal XX1. More specifically, the analog-to-digital converter 135 produces the signal XX1 based on the output voltage 123. Ideally, if the analog-to-digital converter 135 was error free, the digital signal XX1 would accurately indicate a magnitude of the output voltage 123 received at node 198 of the analog-to-digital converter 135. However, the analog-to-digital converter 135 is inaccurate. The signal adjustor 147 adjusts the received signal XX1 produced by the analog-to-digital converter 135 such that the magnitude of the signal XX1' more closely matches or equals the magnitude of the output voltage 123. In such an instance, the power converter 335 is able to more accurately control (regulate) a magnitude of the output voltage 123 to a desired setpoint reference voltage (VID setting 376).

Figure 2A:
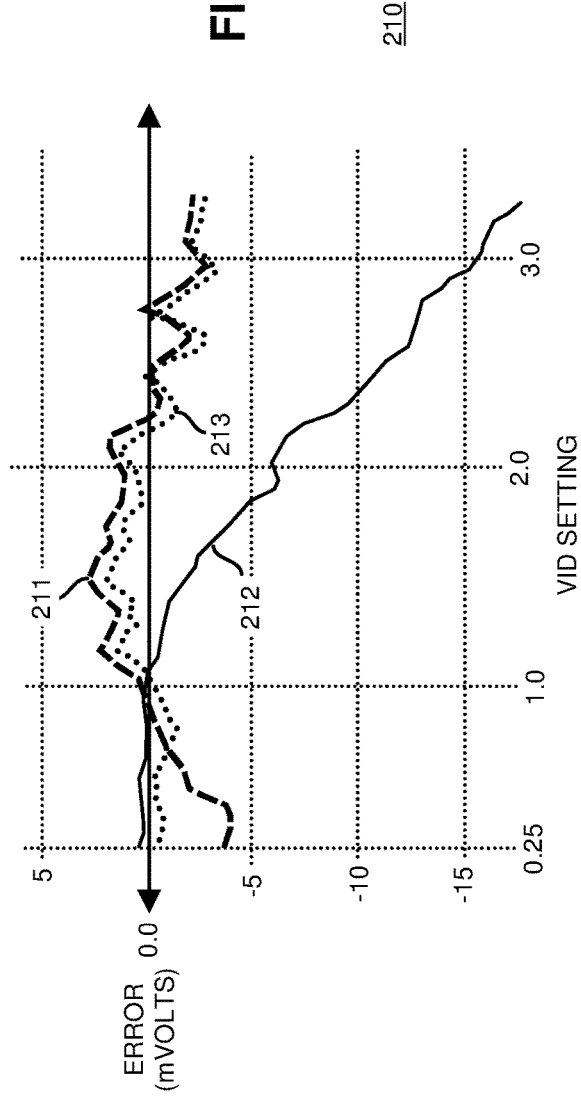
FIG. 2A is an example diagram illustrating an error signal associated with converting a received analog voltage into a digital voltage value according to conventional techniques.
Figure 2B:
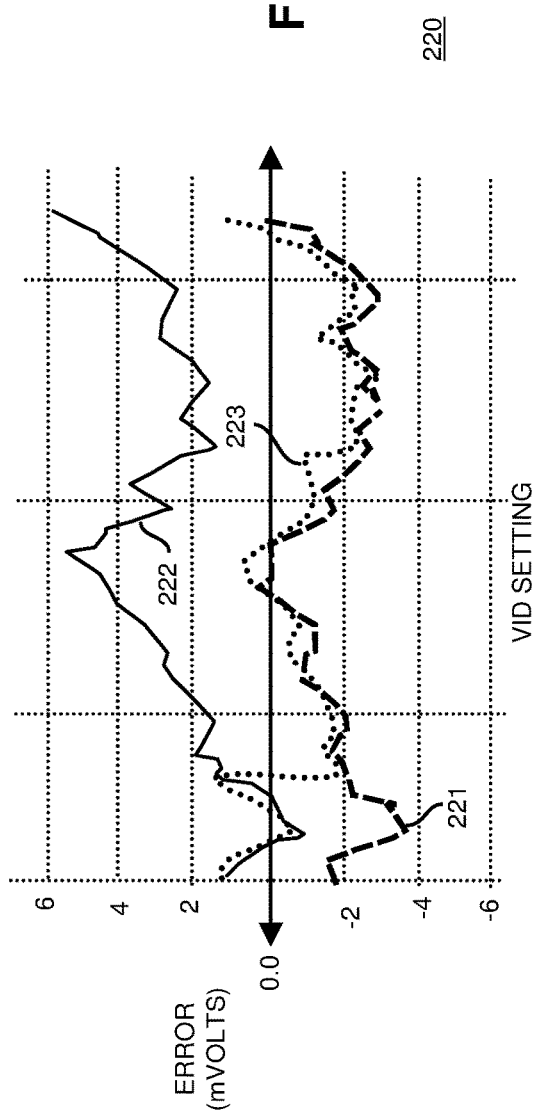
FIG. 2B is an example diagram illustrating results of applying signal adjustment information over multiple different ranges to provide a more accurate generation of a signal as discussed herein.

FIG. 2A is an example diagram illustrating generation of an error associated with a conventional analog-to-digital converter. FIG. 2B is an example diagram illustrating results of applying signal adjustment information in different ranges to provide a more accurate generation of a signal as discussed herein.

As previously discussed, to improve initial set point accuracy for a voltage regulator controller, the signal adjustor 147 implements trimming gain error and offset error with multiple trim points (such as signal adjustment information 126) in different ranges of the full range of VID setting 376. The default trim improves accuracy in the higher input voltage range (~0.8-3 VDC) and a new low range trim is targeted to improve accuracy in the lower voltage range (~0.25-0.8 V).

Trim values may be calculated based on predetermined voltage ranges at Automatic Test Equipment and stored in registers (buffer signal adjustor storing map information 155). For example, as further discussed herein, a tester can be configured to input a voltage at node 198 as well as measure the corresponding digital voltage XX1' outputted from the node 199 over a range of different input values (0.25VDC to 3.0 VDC) to determine the error associated with different inputs and generate the signal adjustment information 126. Yet further as discussed herein, the controller 146 can be configured to implement a comparator to switch between using default or low range trim values based on the VID (target/applied voltage) set by a customer implementing the apparatus 100.

Curve 211 (graph 210) and curve 221 (graph 220) show accuracy measured over the full voltage range of selecting the VID setting 376 using default trim values. Curve 212 and curve 222 show the same measurement using low range trim values. By using default trims only, set point accuracy is worse in voltages<0.8 V compared to using low range trims. Curve 213 and curve 223 shows improved set point accuracy across the full voltage range of possible VID setting 376. Additional details of the power supply circuitry (such as apparatus 100 and/or related circuitry) are discussed in FIGS. 3-6. Further examples of implementing the signal adjustor 147 and signal adjustment information is shown in FIGS. 7-13.

Figure 3:
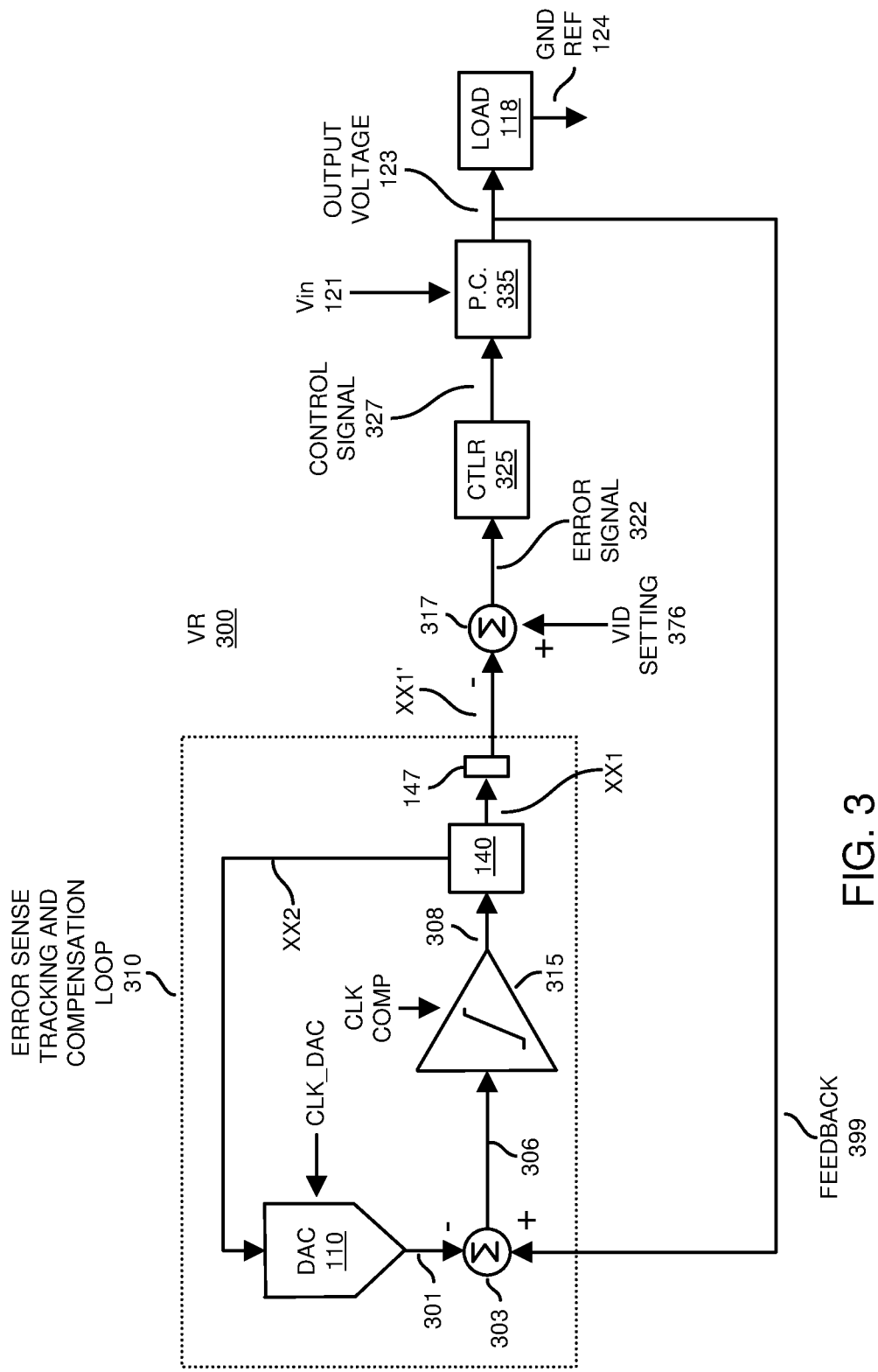
FIG. 3 is an example diagram illustrating a voltage regulator implementing a compensation loop as discussed herein.

FIG. 3 is an example diagram illustrating a voltage regulator implementing a compensation loop as discussed herein.

As shown in FIG. 3, the voltage regulator 300 includes an error sense tracking and compensation loop 310, summer 317, controller 325 (such as a PID controller), power converter 335 (including power converter components such as switches, drivers, inductors, windings, capacitors, etc.), and load 118.

The power converter 335 and corresponding components are operable to convert the input voltage 121 into the output voltage 123 based upon control signals 327 generated by the power converter controller 325. Note that the power converter 335 can be configured in any suitable manner such based on a buck converter topology, boost converter topology, etc.

As further shown, the error sense tracking and compensation loop 310 includes digital-to-analog converter 110, summer 303, comparator 315, and controller 140.

During operation, the summer 303 receives the feedback 339 (such as output voltage 123, ground reference 124) powering the load 118 and produces error signal 306 such as based on a difference between the digital-to-analog converter output signal 301 and the received feedback 399.

The comparator 315 receives the signal 306. The comparator 315 produces a sample of the error signal 308 depending upon a state of the error signal 306 being greater than or less than a threshold value such as 0 or other suitable value. The comparator 315 can be configured to determine whether the error signal 306 is a positive or negative value.

Controller 140 receives and uses the signal 308 as a basis in which to produce and adjust a digital output voltage value (signal XX1) communicated to signal adjustor 147. Signal adjustor 147 may or may not be included in the error sense tracking loop 310. Signal adjustor 147 applies correction or trim and converts the received signal XX1 into signal XX1' inputted to the summer 317. The digital output voltage value (signal XX2) is fed back to the digital-to-analog converter 110. For example, the controller 140 produces a compensated output voltage value that is encoded in accordance with a first encoding format into signal XX1 and a second encoding format into signal XX2. Signal XX2 communicated to the digital to analog converter 110 controls the output of the digital-to-analog converter 110; signal XX1' communicated to the summer 317 is an accurate and compensated digital representation of the output voltage 123 over time. Signal adjustor 147 provides trim adjustment to the signal XX1 to produce a more accurate signal XX1' representing the magnitude of the output voltage 123 (or feedback signal 399). As further discussed herein, the signal adjustor 147 adjusts for errors associated with the analog-to-digital converter (such as error sense tracking and compensation loop 310).

As further shown, the clk-dac signal (sample clock signal) controls updating a state of the digital-to-analog converter 110 according to received control signal XX2; the clk-comp signal (sample clock signal associated with the loop comparator 315) controls sampling of the error signal 306 and generation of error signal 308.

The dynamic load 118 or other suitable entity produces a reference voltage or control setting value (such as VID setting 376) in which to control a magnitude of the output voltage 123. In other words, the voltage regulator 300 is configured to regulate a magnitude of the output voltage 123 to be substantially equal to the reference voltage setting 376.

More specifically, the summer 317 receives the reference voltage setting 376 (such as VID setting) and produces a respective error signal 322 (such as error voltage or error voltage value) based on a difference between the reference voltage setting 376 and the compensated output voltage value XX1 (representation of output voltage 123 including any compensation) authentication server applied by the controller 140.

Based on the error signal 322 indicating whether the magnitude of the output voltage 123 is too high or too low with respect to the reference voltage setting 376, the controller 325 adjusts and produces one or more control signals to control power converter 335, which converts the input voltage 121 into the output voltage 123 that powers the dynamic load 118. The adjustment, over time, to the control signals 327 based on the magnitude of the error signal 322 maintains a magnitude of the output voltage at the desired setting 376.

Note that the magnitude of the reference voltage setting 376 may vary over time. In a manner as previously discussed, the magnitude of the output voltage 123 tracks the setting 376.

Figure 4:
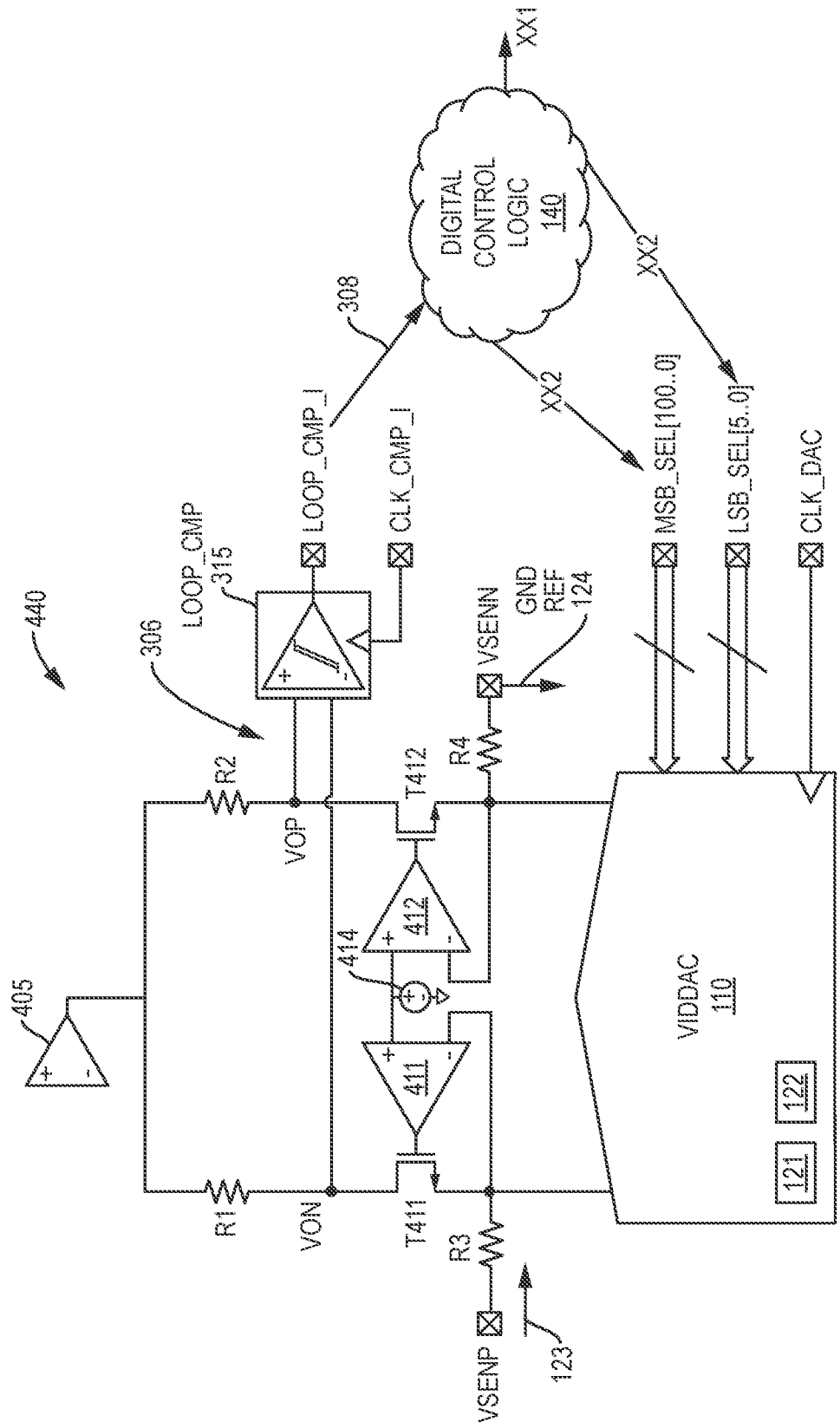
FIG. 4 is a more detailed example diagram illustrating voltage sensor analog-to-digital converter including a compensation loop as discussed herein.

FIG. 4 is a more detailed example diagram illustrating a voltage sensor analog-to-digital converter including a compensation loop as discussed herein.

The error sense tracking and compensation loop 310 includes voltage source 105, resistor R1, resistor R2, amplifier 411, amplifier 412, voltage source 414, transistor T411, transistor T412, resistor R3, resistor R4, digital to analog converter 110, comparator 315, and controller 140. The digital-to-analog converter 110 include multiple current drive modules controlled by control signals XX2.

In general, the digital-to-analog converter 110 controls sinking of current (a.k.a., output current) with respect to the error sense circuitry 440. As shown, the error sense circuitry 440 receives the output voltage 123 at node VSENP and ground reference 124 at node VSENN. The comparator 315 monitors the error signal 306 such as a difference between the voltage at node Von and node Vop and produces respective error signal 308, which represents a sample of the difference voltage.

Ideally, if the digital-to-analog converter 110 is set to the proper setting via signal XX2 (controlling respective current drive modules), then the error signal 306 is zero. In such an instance, the current from voltage source 405 through R1 equals the current from voltage source 405 through R2. However, when there is an imbalance of current through resistor R1 and resistor R2, the comparator 350 produces a respective error signal 308 provided to the controller 140. In response to the detected error 308, the controller 140 adjusts the control signal XX2 up or down such that the error signal 306 goes to zero.

As previously discussed, in addition to generating the control signal XX2, the controller 140 generates the signal XX1, which is a digital representation of the output voltage 123 as indicated by the feedback 399 (of FIG. 3). The signal XX1 and signal XX2 indicate the same value except that they are encoded in different encoding formats. For example, as further discussed herein, all or a portion of the signal XX2 is thermometer encoded to control activation of one or more current drive modules 121 in the digital to analog converter 110. Signal XX1 (as well as XX1') may be a standard binary coded signal indicating a magnitude of the output voltage 123 (i.e., difference between output voltage 123 and the reference voltage 124), where XX1' is the trim corrected digital rendition of the output voltage.

Thus, the digital-to-analog converter 110 including multiple current drive modules 121 resides in error sense tracking and compensation loop 310. As further discussed herein, the digital-to-analog converter 110 controls a magnitude of current through the error sense circuitry 440 via control of the current drive modules. More specifically, the controller 140 controls the magnitude of the current through the error sense circuitry 440 via operation of a sequence of current drive modules 121 including the current drive module 121-1, the current drive module 121-2, current drive module 121-3, etc. The digital-to-analog converter 110 may also include current drive modules 122.

The error sense tracking and compensation loop 310 as discussed herein improves the accuracy along with lifetime and temperature drift of error sense circuitry 440 and corresponding digital-to-analog converter 110 (a.k.a., a voltage sense analog-to-digital converter), which is used to measure the setpoint voltage of a switching DC-DC converter. As previously discussed, FIG. 3 illustrates a generic Switching DC-DC converter with a digital control loop. Referring again to FIG. 4, the customer or other suitable entity programs the voltage identification 'VID' voltage (a.k.a., VID setting 376), which is the desired magnitude of the output voltage 123. The voltage sensor ADC (error sense tracking and compensation loop 310) digitizes the received output voltage sample as signal XX1. Via the summer 317, the digital control loop subtracts the output XX1 of the VSADC from the setting 376 and generates an error signal 322 (such as an error voltage). The error signal 322 is then fed to the controller 325 such as a digital 'PID' control loop to generate pulses (control signal 327) to control the switching of the power converter 335 to generate the output voltage 123 to power the load 118.

The Voltage Sensor (such as including the error sense circuitry 440) for the controller of a DCDC converter consists of a tracking ADC which digitizes the error between the input voltage 121 and DAC using a single or multiple loop comparators (such as comparator 315). FIG. 4 further illustrates the core of the initial tracking ADC, which digitizes the error voltage using the input current, which itself is equal to the difference between VSENP and VSENN divided by the input resistance (resistor R3 and R4).

Figure 5:
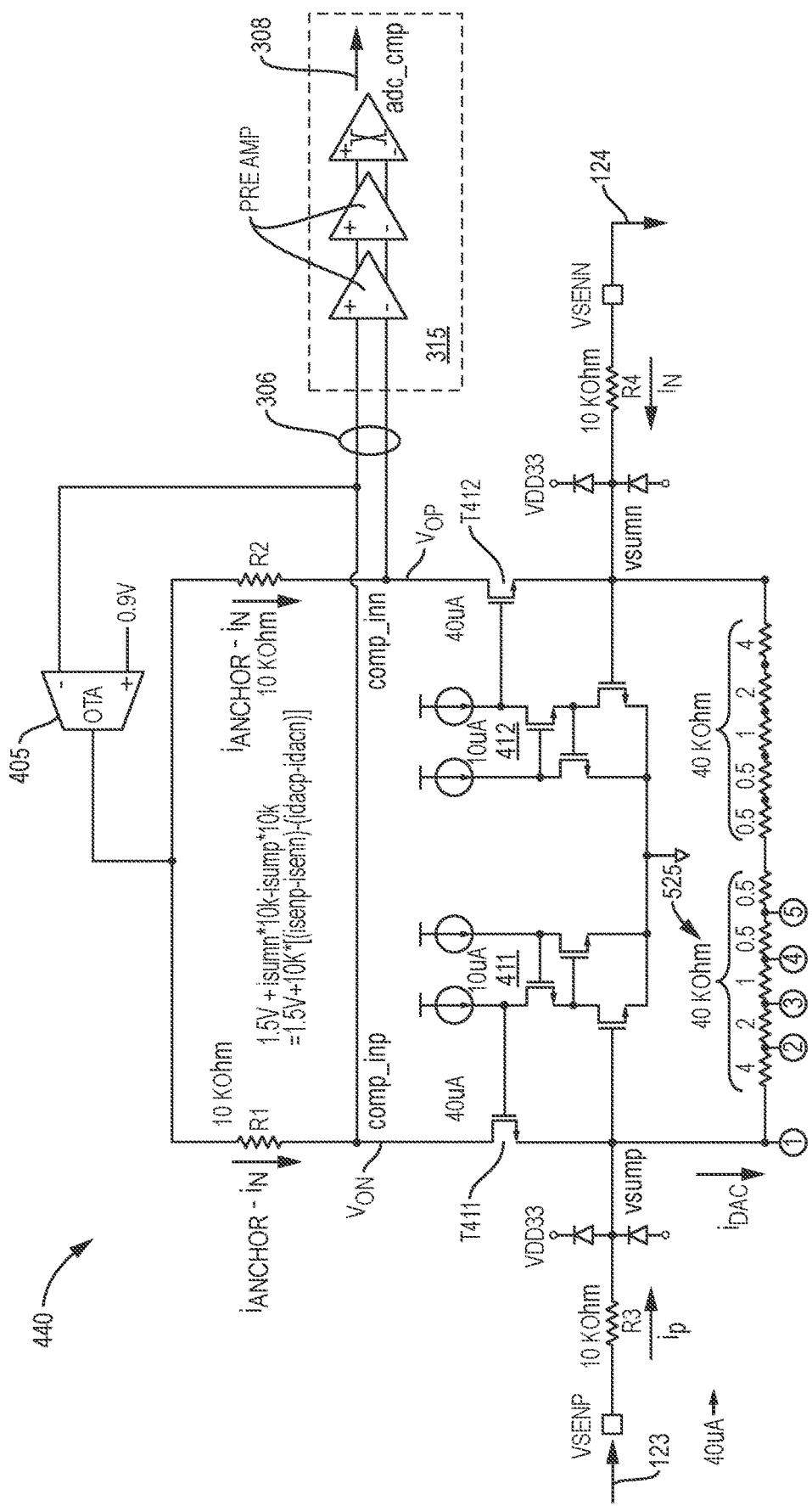
FIG. 5 is an example diagram illustrating a sensor circuit associated with a compensation loop as discussed herein.
Figure 6:
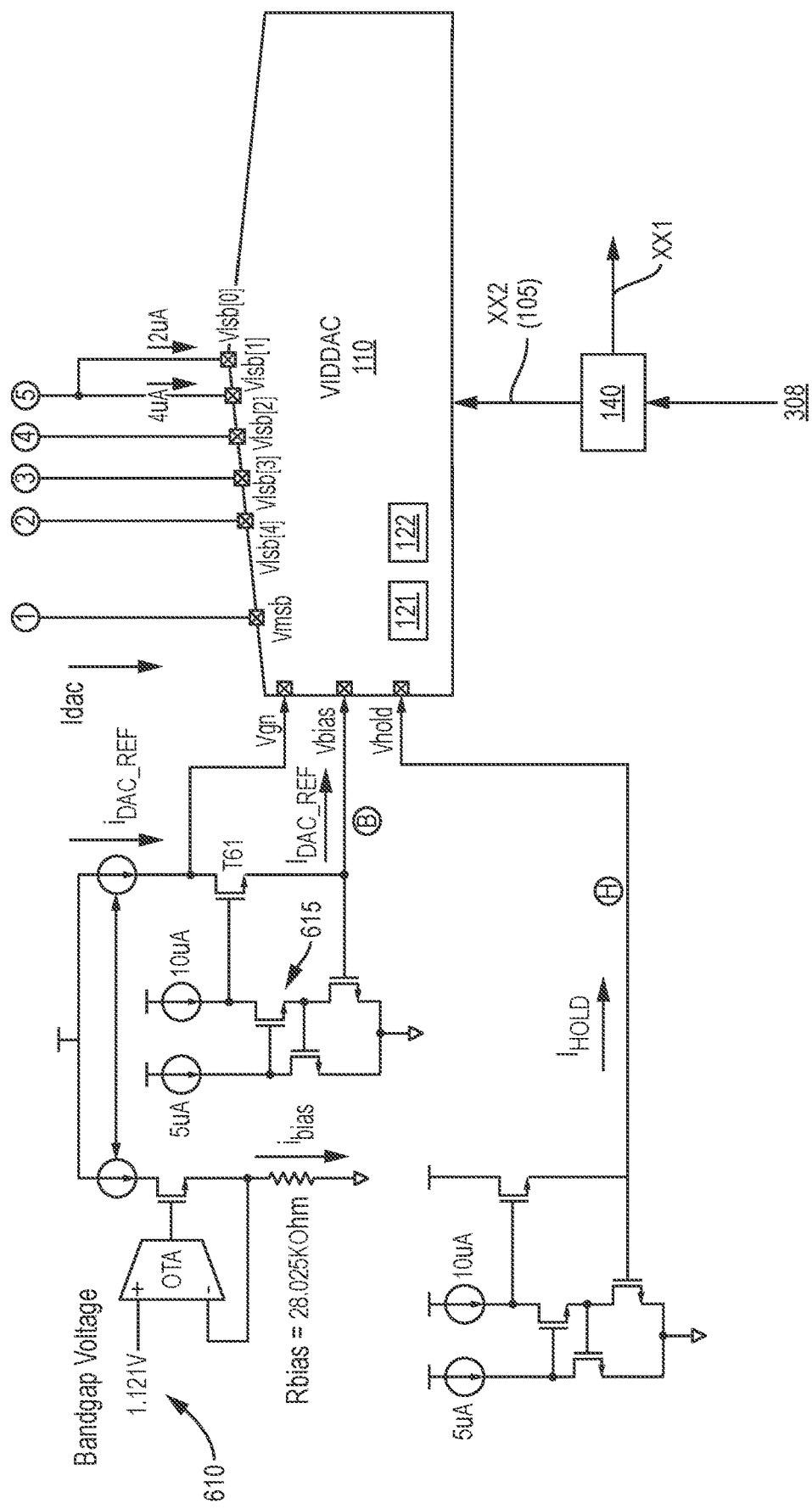
FIG. 6 is an example diagram illustrating an analog-to-digital converter (such as a VIDDAC) and corresponding compensation loop circuitry as discussed herein.

FIG. 5 is an example diagram illustrating a sensor circuit associated with a compensation loop as discussed herein. FIG. 6 is an example diagram illustrating a VIDDAC and corresponding circuitry associated with a compensation loop as discussed herein.

The following discussion references both FIGS. 5 and 6.

In this example, the current Ip supplied by the output voltage 123 passes through the resistor R3 (such as a 10 kilo-ohm resistor) to node Vsump (same as node Vmsb, which is the output node of the digital-to-analog converter 110). The current supplied by the ground reference voltage 124 passes through the resistor R4 (such as a 10 kilo-ohm resistor) to node Vnump. As previously discussed, the digital-to-analog converter 110 sinks current (such as output current Idac).

The error signal 306 represents a difference in the voltage Von and voltage Vop. Voltage Von is equal to the voltage Va (from source 405) minus the current through the resistor R1; voltage Vop is equal to the voltage Va minus the current through the resistor R2. Resistors 525 provide weighted sinking of current associated with current drive modules 122 driven by corresponding LSB select signals of signal XX2.

The voltage at node Vsump controls the operation of amplifier 411 and corresponding switch T411. The voltage at node Vsumn controls the operation of amplifier 412 and corresponding switch T412. As previously discussed, via selection of the current drive modules and modes, the controller 140 controls a flow of current Idac such that the magnitude of the error signal 306 is adjusted towards a value of zero.

Reasons for Drift in the Digital-to-Analog Converter 110

Thus, a more detailed figure of the error sense tracking and compensation loop 315 (a.k.a., analog tracking loop) is shown in FIGS. 5 and 6. In FIG. 6, the current IDAC=ISIG=Ip−In.

The current Ibias is generated from the bandgap voltage 610 (such as 1.121VDC or other suitable value) divided by the resistor Rbias (such as 28.025 Kohms). The current Ibias is mirrored using PMOS devices 615 to generate the main reference current Idac-ref supplied to the digital-to-analog converter through transistor T61.

The drift error can be separated into gain error drift or offset error drift. The main cause of gain error drift is due to a mismatch drift in the mirroring of Ibias to Idac_ref.

$I\_SIG = (V\_SENP - V\_SENN)/R\_IN = I\_(DAC\_REF)$
$*N = V\_BG/R\_BIAS * \varepsilon\_MIRROR * 4 * N$ N=ADC code, which is # of VID-DAC (current drive modules) cells activated εMIRROR=error of current mirror mismatch $$N = \frac{R_{BIAS} * (V_{SENP} - V_{SENN})}{R_{IN} * V_{BG} * \varepsilon_{MIRROR} * 4}$$

RBIAS & RIN are very well matched and track over temperature

Main error source is from the PMIRROR mismatch

Reasons for drift associated with current drive modules include:

Package stress

Mismatch between current drive modules over the temperature range-threshold voltage mismatch and current factor mismatch The mismatch could change due to stress over temperature The VIDDAC is a current steering DAC which adds current mirror legs to the 'vsump' node or 'P leg' as the setpoint voltage rises. The current steering DAC is made out of NMOS devices mirrored from a main master device biased from the 'Idac_ref' current Accuracy is also set by the linearity of the analog-to-digital converter 110 (a.k.a., VIDDAC). The controller 140 has two points for conducting the gain trim and one point for conducting the offset trim. Due to inherent non-linearity of the VIDDAC, the setpoint accuracy is highest at the trim point where both gain and offset are conducted. It is the second best at the second gain trim point. In the region in between the trim points, accuracy degrades the furthest away the setpoint is from the trim points.

As further discussed herein, the controller 140 monitors a magnitude of the error signal 306 as generated by the error sense circuitry 440. The controller 140 operates the digital-to-analog converter 110 and adjusts settings (such as bias mode B, hold mode H, active mode M, inactive mode, etc.) of the current drive modules over time based on the received error signal 306. The adjustment to the settings of current drive modules results in adjustment of a magnitude of the current Idac through the error sense circuitry 440. The adjustments of the magnitude of the current Idac (up or down) reduces a magnitude of the error signal 306 towards zero, resulting in the signals XX1 and XX2 being a more accurate digital representations of the output voltage 123 with respect to the reference voltage 124.

Figure 7:
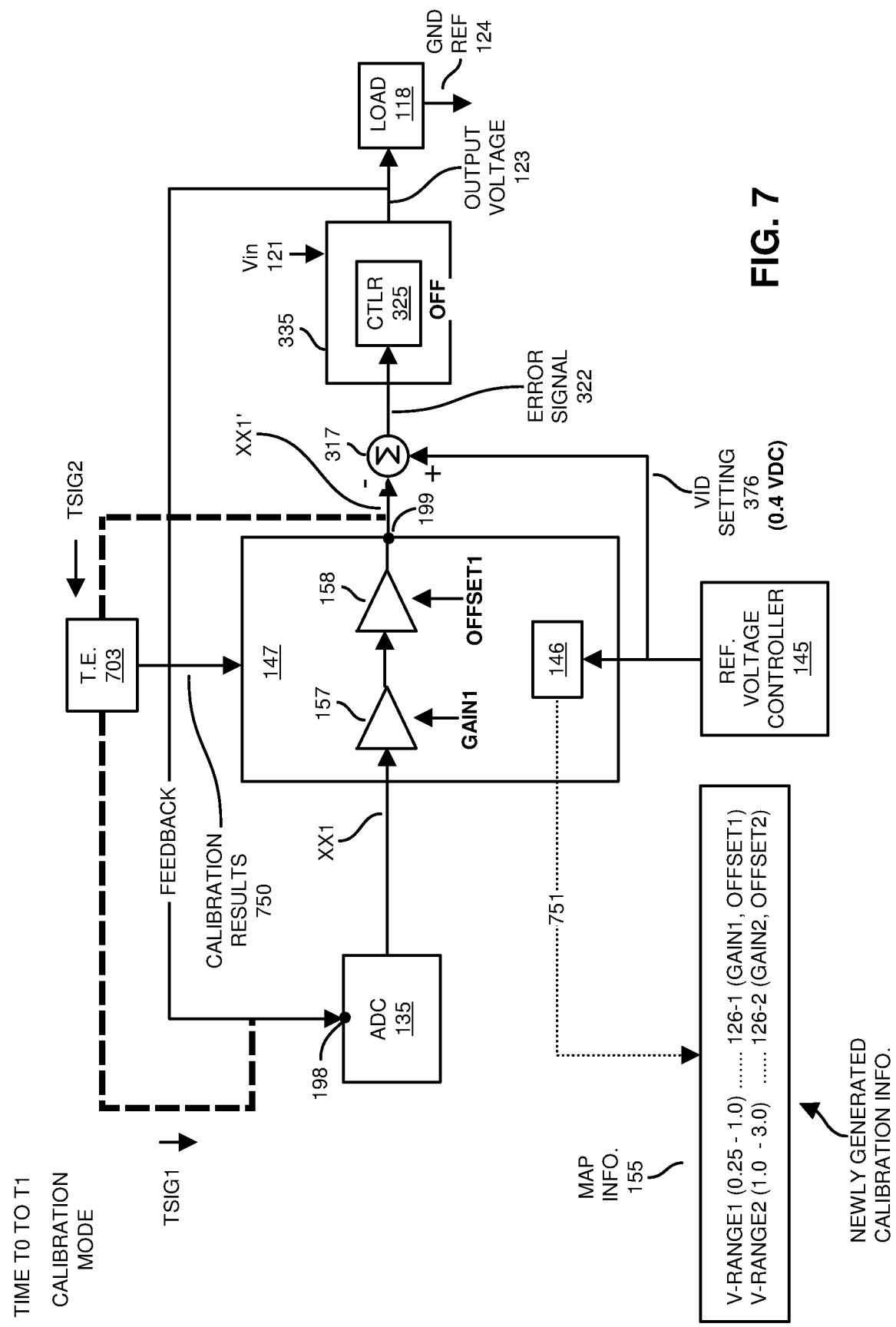
FIG. 7 is an example diagram illustrating implementation of a calibration mode to produce signal adjustment information as discussed herein.

FIG. 7 is an example diagram illustrating implementation of a calibration mode as discussed herein.

In this example calibration mode between time T0 and time T1, the power converter is OFF; GAINX=1, OFFSETX=0. Test equipment 703 applies an analog signal TSIG1 (test samples) to node 198 of the analog-to-digital converter 135. The analog-to-digital converter 135 and the signal adjustor 147 are powered. For each sample of the test signal TSIG1, the analog-to-digital converter 135 and corresponding signal adjustor 147 produce the signal TSIG2 (akin to signal XX1') supplied from node 199 to the test equipment 703. Via the samples at different settings of the test signal TSIG1, the test equipment 703 produces the curve 710 in FIG. 8 to illustrate/determine the error associated with analog-to-digital converter 135 and/or signal adjustor 147. Test equipment 703 provides the calibration results 750 (samples of input voltage TSIG1 at node versus samples of TSIG2 produced by the node 199) to the signal adjustor 147. Based on the calibration results 750, the signal adjustor 147 or other suitable entity produces the signal adjustment information 126 stored in map information 155.

Figure 8:
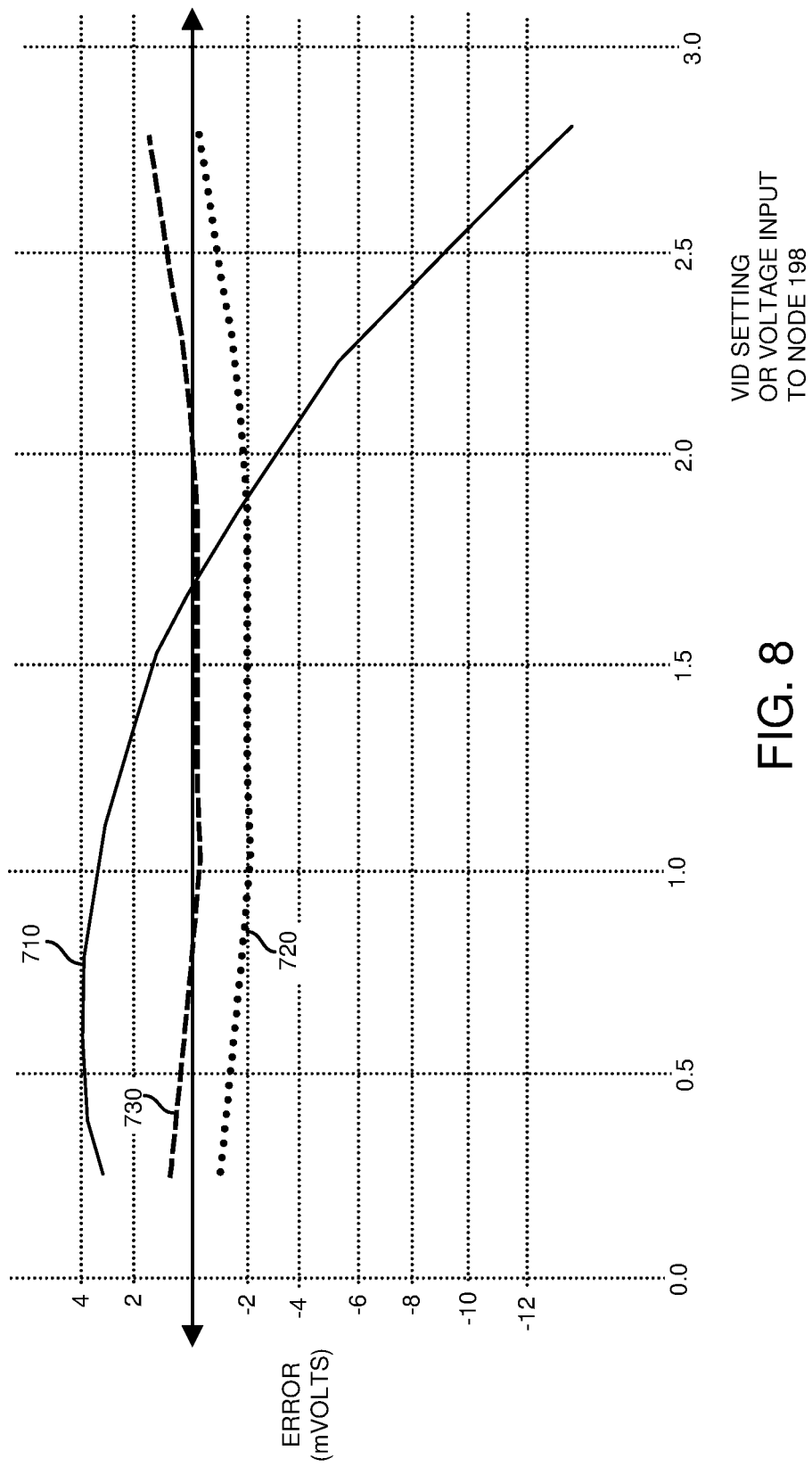
FIG. 8 is an example graph illustrating error associated with converting a received analog voltage into a digital voltage value according to conventional techniques.

FIG. 8 is an example graph illustrating an error associated with converting an input voltage into an output voltage according to conventional techniques.

Curve 710 illustrates an error associated with the analog-to-digital converter 135 generating the signal XX1' from input signal XX1. For example, to determine the error, and curve 710, test equipment 703 (such as in FIG. 7) applies different input voltages (signal adjustor along x-axis between 0.25VDC and 2.8VDC) at node 198 (while other circuitry such as power converter 335 is depowered). The analog-to-digital converter 135 (such as error sense tracking loop 310 or other suitable entity) and signal adjustor 147 convert the received voltage at node 198 into signal XX1' from mode 199. The first portion of the error signal (curve 710) between 0.25VDC and 1.0VDC may be linear or non-linear; the second portion of the error signal (curve 710) between 1.0VDC and 2.8VDC may be linear or non-linear.

The test equipment 703 or other suitable entity determines the error associated with VID setting 376 for each of multiple VID settings values inputted to the node 198. For example, assume that the test equipment inputs 0.5VDC (sample of TSIG1) into node 198. The analog-to-digital converter 135 converts the 0.5VDC signal inputted to node 198 into signal XX1' such as 0.504VDC (TSIG2). In such an instance, the error for VID setting=0.5 VDC equals 0.504–0.500=0.004 VDC. See curve 710.

Assume that the test equipment inputs 1.0VDC into node 198. The analog-to-digital converter 135 converts the 1.0VDC signal (TSIG1) inputted to node 198 into signal XX1' (TSG2) such as 1.0032VDC. In such an instance, the error for VID setting=1.0 VDC equals 0.0032 VDC. In this manner, the test equipment produces the curve 710 for each of multiple samples of TSIG1.

The gain correction coefficient for a given range may be calculated by measuring slope of the initial error curve 710 at two chosen points. The initial error is divided by the gain correction coefficient to obtain the gain trim corrected error 720 (a.k.a., residual error). The test equipment 703 or other suitable entity (signal adjustor signal adjustor 147) determines an offset error associated with the gain trim corrected curve 720 at a point such as 1.5VDC. At such a point, the curve is offset from zero by 2mVDC. Applying the offset value of +2mVDC to the gain trim corrected curve 720 results in curve 730 representing gain and offset corrected trim signal.

In this illustration, a single set of points for only a single range of VID setting 376 (0.25 to 2.8 VDC) illustrates that gain and offset correction using the same values over the full range results in a lower error across the full range as indicated by the curve 730. Ideally, curve 730 is equal to zero along the range of 0.25 to 2.8 VDC.

Figure 9:
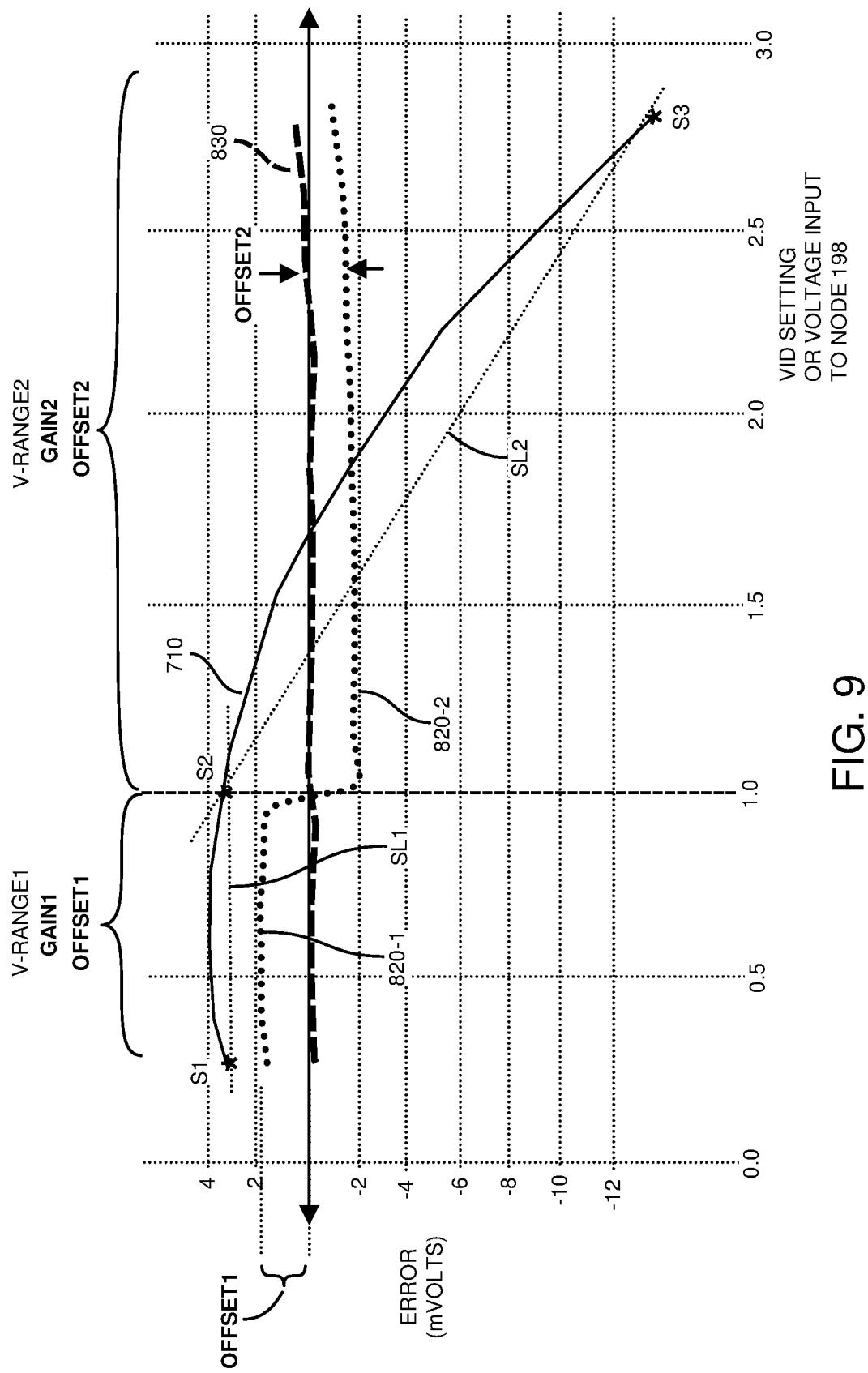
FIG. 9 is an example diagram illustrating implementation of different signal adjustment information in different ranges to produce a more accurate feedback signal as discussed herein.

FIG. 9 is an example diagram illustrating results of applying signal adjustment information to a received signal to produce a more accurate output signal as discussed herein.

As previously discussed, the signal adjustor 147 can be configured to partition the input range of VID setting voltages applied to the node 198. For example, in a similar manner as previously discussed, the test equipment 703 inputs different voltage values (TSIG) into node 198 (while GAINX=1 and OFFSETX=0) and measures a corresponding signal XX1' (TSIG2) generated at node 199 to produce the curve 710 indicating an error between the analog input voltage at node 198 and the output voltage at node 199.

Assume that the signal adjustor 147 or other suitable entity partitions the full range associated with VID setting 376 and/or the output voltage feedback signal into two ranges. For example, assume that the full range of possible VID setting and corresponding magnitude of the output voltage feedback signal 123 is between 0.25VDC and 2.8VDC. To provide better accuracy as discussed herein, the full range (0.25 to 2.8VDC) is split to include V-RANGE1 (between 0.25VDC and 1.0 VDC) and V-RANGE2 (between 1.0VDC and 2.8 VDC).

The set of signal adjustment information 126 including adjustor gain setting (GAINX) and offset setting (OFFSETX) for each range can be determined in any suitable manner.

For example, a first gain adjustment value (GAIN1) for the V-RANGE1 can be determined via a first slope (such as slope SL1 between sample S1 @ 0.25VDC and sample S2 @ 1.0VDC for the curve 710) for the first voltage range of the VID setting or offs between 0.25 and 1.0 VDC. As previously discussed, the first portion of the curve 710 (error signal for the analog-to-digital converter 135 generating the values 0.25 to 1.0 VDC) is obtained during calibration of circuitry (such as the analog-to-digital converter 135) producing the signal XX1. In this example, GAIN1=1/SL1; where SL1=((1.0+3 m)−(0.25+3 m))/(1.0−0.25)=1. The OFFSET1=1.8mVDC (such as an average difference or difference at selected point between curve 820-1 and zero). Note that any suitable technique can be used to determine an appropriate GAIN1 and OFFSET1 for V-RANGE1.

A second gain adjustment value (GAIN2) for the V-RANGE2 can be determined via a second slope (such as slope SL2 between sample S2 @ 1.0VDC and sample S3 @ 2.8VDC for the curve 710) for the second voltage range of the VID setting or output voltage feedback signal inputted to node 198 between 0.25 and 1.0 VDC. As previously discussed, the second portion of the curve 710 (error signal for the analog-to-digital converter 135 generating the values 1.0 to 2.8 VDC) is obtained during calibration of circuitry (such as the analog-to-digital converter 135) producing the signal XX1. In this example, GAIN2=1/SL2; where SL2=(3mVDC-(−14mVDC)/(2.8−1.0). The OFFSET2=1.6mVDC (such as an average difference or a single point between curve 820-2 and zero). Note that any suitable technique can be used to determine an appropriate GAIN2 and OFFSET2 for V-RANGE2.

Implementation of different gain and offset values for each of multiple ranges reduces error associated with converting signal at node 198 into signal XX1'. For example, curve 830 (error after applying signal adjustment information 126 for different ranges) illustrates almost zero error for all ranges.

Figure 10:
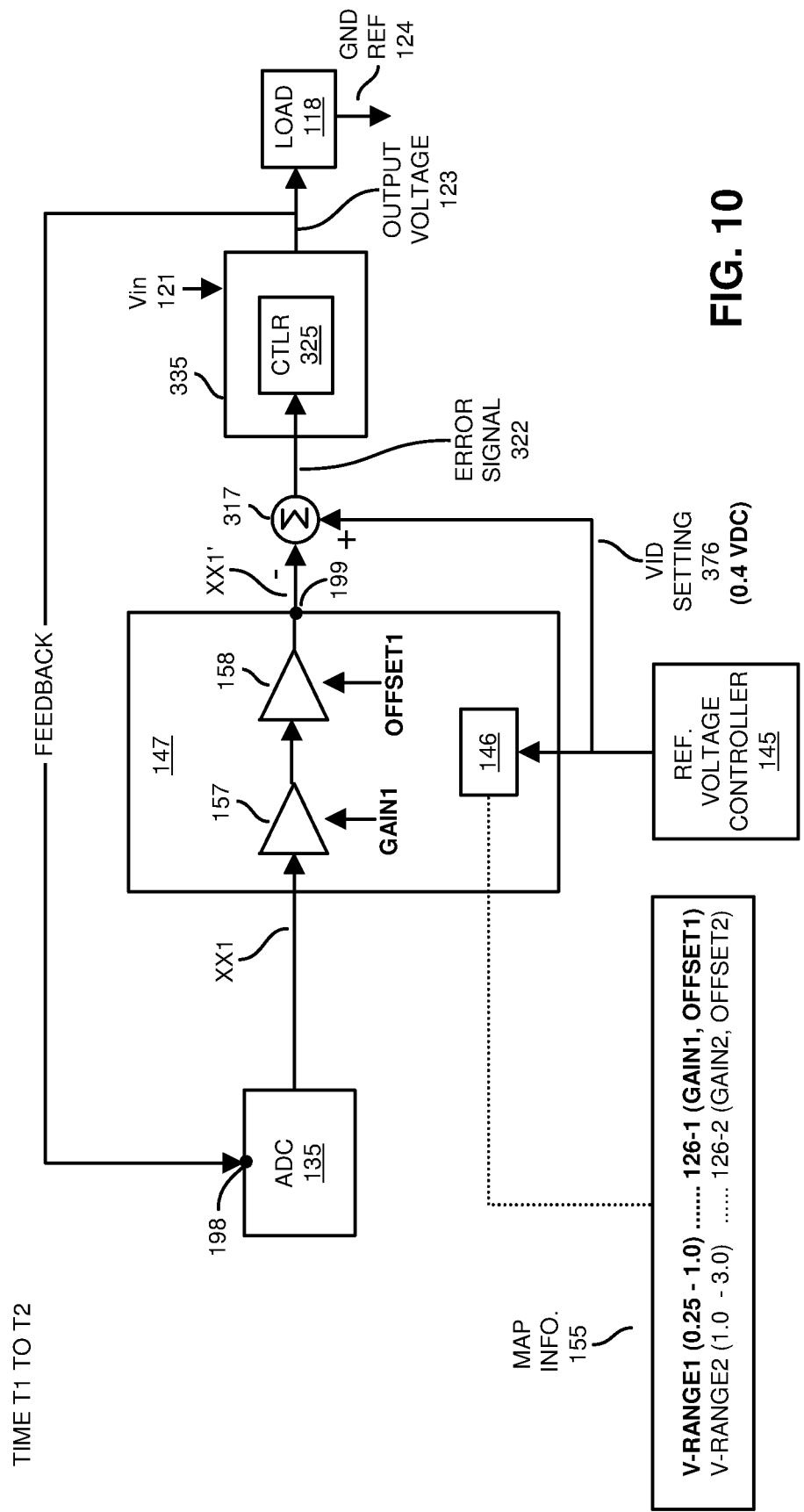
FIG. 10 is an example diagram illustrating mapping of a setpoint reference voltage to a first voltage range and applying corresponding adjustment information associated with the first voltage range to a received feedback signal to produce a corrected version of the received feedback signal as discussed herein.

FIG. 10 is an example diagram illustrating mapping of a setpoint reference voltage to a first voltage range and applying adjustment information associated with the first voltage range to a received feedback signal as discussed herein.

In this example, as previously discussed, the signal adjustor 147 is disposed in a (feedback) circuit path between analog-to-digital converter 135 producing the signal XX1 and an error signal generator (summer 317) receiving the signal XX1'. Feedback loop (feedback circuit path) includes analog-to-digital converter 135, signal adjustor 147, summer 317 to power converter 335.

As previously discussed, the signal adjustor 147 and corresponding gain/offset controller 146 has access to map information 155, which maps sets of signal adjustor 126 to different voltage ranges and sets of signal adjustment information 126. The map information 155 is generated in a manner as previously discussed during calibration of the analog-to-digital converter 135 (error sense tracking loop 310).

As more specifically shown, the map information 155 includes multiple sets of signal adjustment information such as including first signal adjustment information 126-1 and second signal adjustment information 126-2. The first signal adjustment information 126-1 (GAIN1 and OFFSET1) of map information 155 is assigned to a first voltage range (0.25VDC to 1.0VDC) of controlling the signal adjustor 147 based on a selected setpoint reference voltage (VID setting 376). As previously discussed, the first signal adjustment information 126-1 may include a first gain adjustment value GAIN1 derived from a first slope SL1 of the error signal (curve 710) for a first voltage range V-RANGE1. The first portion of the error signal (curve 710) is obtained during calibration of circuitry (signal adjustor 147 and/or analog-to-digital converter 135) producing the signal XX1 or signal XX1' as previously discussed.

The second signal adjustment information 126-2 (GAIN2 and OFFSET2) of map information 155 is assigned to a second voltage range (1.0VDC to 2.8VDC) of controlling the signal adjustor 147 based on a selected setpoint reference voltage (VID setting 376). As previously discussed, the second signal adjustment information 126-2 may include a second gain adjustment value GAIN2 derived from a second slope SL2 of the error signal (curve 710) for a second voltage range V-RANGE2. The second portion of the error signal (curve 710) is obtained during calibration of circuitry (signal adjustor 147 and/or analog-to-digital converter 135) producing the signal XX1 or signal XX1'.

Assume that the system 100 is powered in a non-calibration mode such that the power converter 335 converts the input voltage 121 into the output voltage 123 between time T1 and time T2. In such an instance, at time T1 (or between time T1 and T2), the reference voltage controller 145 produces the VID setting 376 to be 0.4 VDC.

At or around time T1, the controller 146 of the signal adjustor 147 receives the VID setting of 0.4VDC. The controller 146 of the signal adjustor 147 determines that the VID setting of 0.4 VDC falls within the range V-RANGE1. The controller 146 retrieves the corresponding signal adjustment information 126-1 (GAIN1 and OFFSET1) from the map information 155 and applies GAIN1 to the gain stage 157 and OFFSET1 to the offset stage 158. The analog-to-digital converter 135 receives the output voltage feedback signal at node 198 and produces respective signal XX1. The signal adjustor 147 produces the adjusted signal XX1' using GAIN1 and OFFSET1. In such an instance, the signal XX1'=(XX1*GAIN1)+OFFSET1. The error signal generator (summer 317) receive the setpoint reference voltage (VID setting=0.4VDC) and the adjusted signal XX1'. The error signal generator generates an error signal 322 based on a difference between the signal XX1' and the selected setpoint reference voltage (0.4VDC). Via the error signal 322, the power converter 335 produces the magnitude of the output voltage 123 to be substantially equal to the setpoint reference voltage (VID setting) of 0.4VDC.

The VID setting may vary between 0.25VDC and 1.0VDC between time T1 and T2. However, the controller 146 applies the same signal adjustment information 126-1 to the gain stage and the offset stage of signal adjustor 147.

To provide stability upon switching from one range to another, the ranges may overlap. For example, the signal adjustment information 126-1 can be assigned to the voltage range between 0.25 and 1.1VDC. Signal adjustment information 126-2 can be assigned to the voltage range between 0.9 and 2.8VDC. Thus, the respective voltage ranges V-RANGE1 and V-RANGE2 may overlap with each other.

Figure 11:
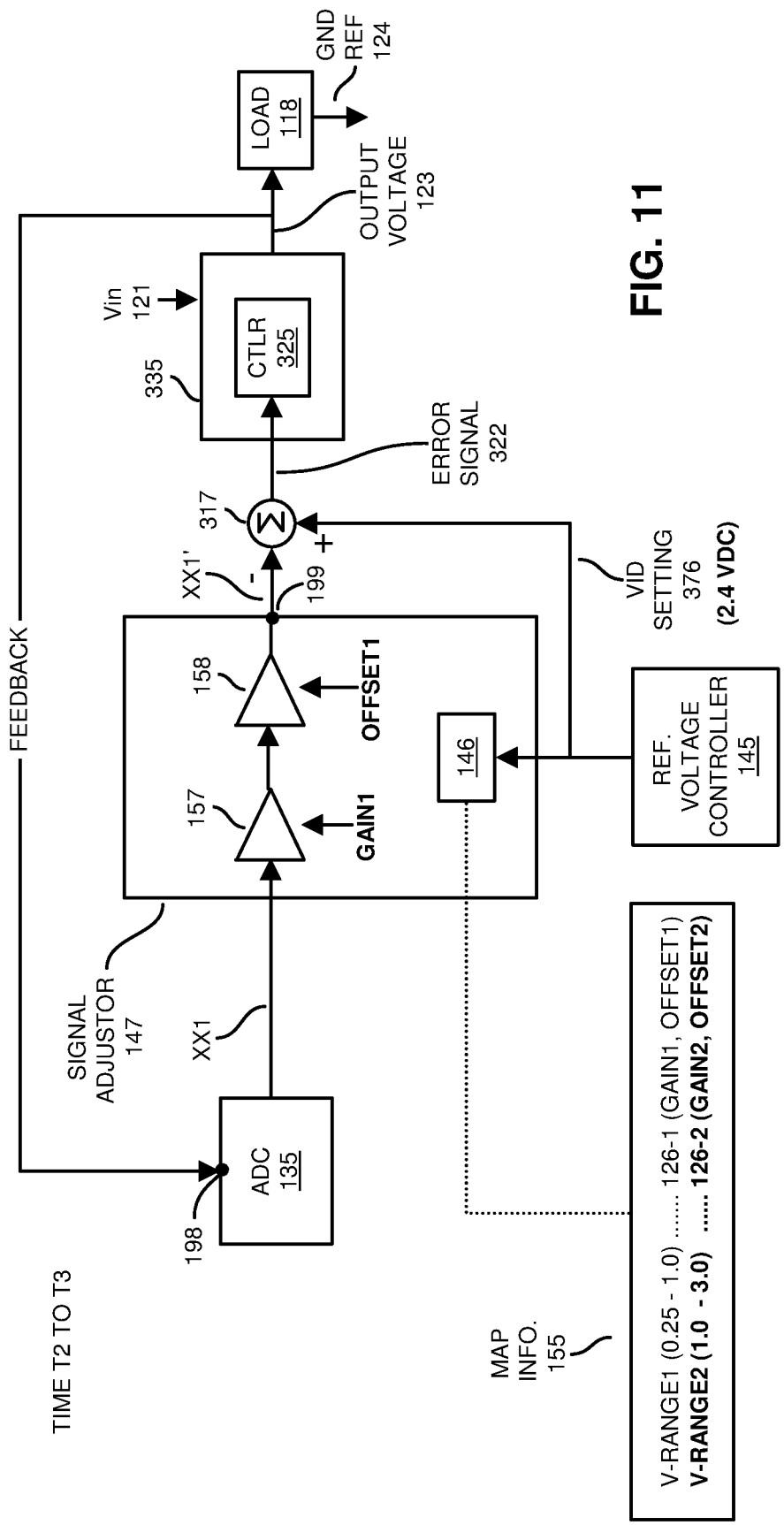
FIG. 11 is an example diagram illustrating mapping of a setpoint reference voltage to a second voltage range and applying corresponding adjustment information associated with the second voltage range to a received feedback signal to produce a corrected version of the received feedback signal as discussed herein.

FIG. 11 is an example diagram illustrating mapping of a setpoint reference voltage to a second voltage range and applying adjustment information associated with the second voltage range to a received feedback signal as discussed herein.

Assume that the system 100 is powered in a non-calibration mode such that the power converter 335 converts the input voltage 121 into the output voltage 123 between time T2 and time T3. In such an instance, at time T2 (or between time T2 and T3), the reference voltage controller 145 produces the VID setting 376 to be 2.4 VDC.

At or around time T2, the controller 146 of the signal adjustor 147 receives the new VID setting of 2.4VDC. The controller 146 of the signal adjustor 147 determines that the VID setting of 2.4 VDC falls within the range V-RANGE2. The controller 146 retrieves the corresponding signal adjustment information 126-2 (GAIN2 and OFFSET2) from the map information 155 and applies GAIN2 to the gain stage 157 and OFFSET2 to the offset stage 158. The analog-to-digital converter 135 receives the output voltage feedback signal at node 198 and produces respective signal XX1. The signal adjustor 147 produces the adjusted signal XX1' using GAIN2 and OFFSET2. In such an instance, the signal XX1'=(XX1*GAIN2)+OFFSET2. The error signal generator (summer 317) receive the setpoint reference voltage (VID setting=2.4VDC) and the adjusted signal XX1'. The error signal generator generates an error signal 322 based on a difference between the signal XX1' and the selected setpoint reference voltage (2.4VDC). Via the error signal 322, the power converter 335 produces the magnitude of the output voltage 123 to be substantially equal to the setpoint reference voltage (VID setting) of 2.4VDC.

The VID setting may vary between 1.0VDC and 2.8VDC between time T2 and T3. However, the controller 146 applies the same signal adjustment information 126-2 to the gain stage and the offset stage of signal adjustor 147.

As previously discussed, to provide stability upon switching from one range to another, the ranges may overlap. For example, the signal adjustment information 126-1 can be assigned to the voltage range between 0.25 and 1.1VDC. Signal adjustment information 126-2 can be assigned to the voltage range between 0.9 and 2.8VDC. Thus, the respective voltage ranges V-RANGE1 and V-RANGE2 may overlap with each other.

Figure 12:
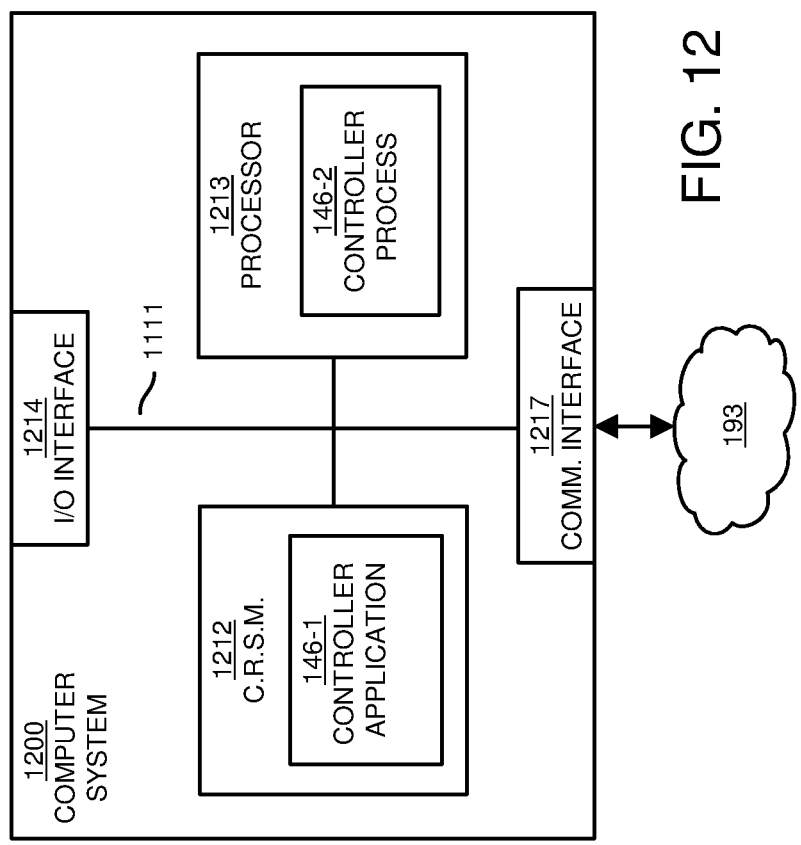
FIG. 12 is an example diagram illustrating computer processor hardware and related software instructions that execute one or more methods as discussed herein.

FIG. 12 is an example block diagram of a computer device for implementing any of the operations as discussed herein.

As shown, computer system 1200 (such as implemented by signal adjustor 147, controller 146, test equipment 703, etc.) of the present example includes an interconnect 1211 that couples computer readable storage media 1212 such as a non-transitory type of media (or hardware storage media) in which digital information can be stored and retrieved, a processor 1213 (e.g., computer processor hardware such as one or more processor devices), I/O interface 1214, and a communications interface 1217.

I/O interface 1214 provides connectivity to any suitable circuitry such as one or more voltage converters 165.

Computer readable storage medium 1212 can be any hardware storage resource or device such as memory, optical storage, hard drive, floppy disk, etc. The computer readable storage medium 1212 may store instructions and/or data used by the frequency controller application 340-1 to perform any of the operations as described herein.

Further, communications interface 1217 enables the computer system 1200 and processor 1213 to communicate over a resource such as network 190 to retrieve information from remote sources and communicate with other computers.

As shown, computer readable storage media 1212 is encoded with controller application 146-1 (e.g., software, firmware, etc.) executed by processor 1213. Controller application 146-1 can be configured to include instructions to implement any of the operations as discussed herein.

During operation, processor 1213 accesses computer readable storage media 1212 via the use of interconnect 1211 in order to launch, run, execute, interpret or otherwise perform the instructions in controller application 146-1 stored on computer readable storage medium 1212.

Execution of the controller application 146-1 produces processing functionality such as controller process 146-2 in processor 1213. In other words, the controller process 146-2 associated with processor 1213 represents one or more aspects of executing controller application 146-1 within or upon the processor 1213 in the computer system 1200.

In accordance with techniques as discussed herein, note that computer system 1200 can be a micro-controller device, logic, hardware processor, hybrid analog/digital circuitry, etc., configured to control a power supply and perform any of the operations as described herein.

Functionality supported by the different resources will now be discussed via flowchart in FIG. 12. Note that the steps in the flowcharts below can be executed in any suitable order.

Figure 13:
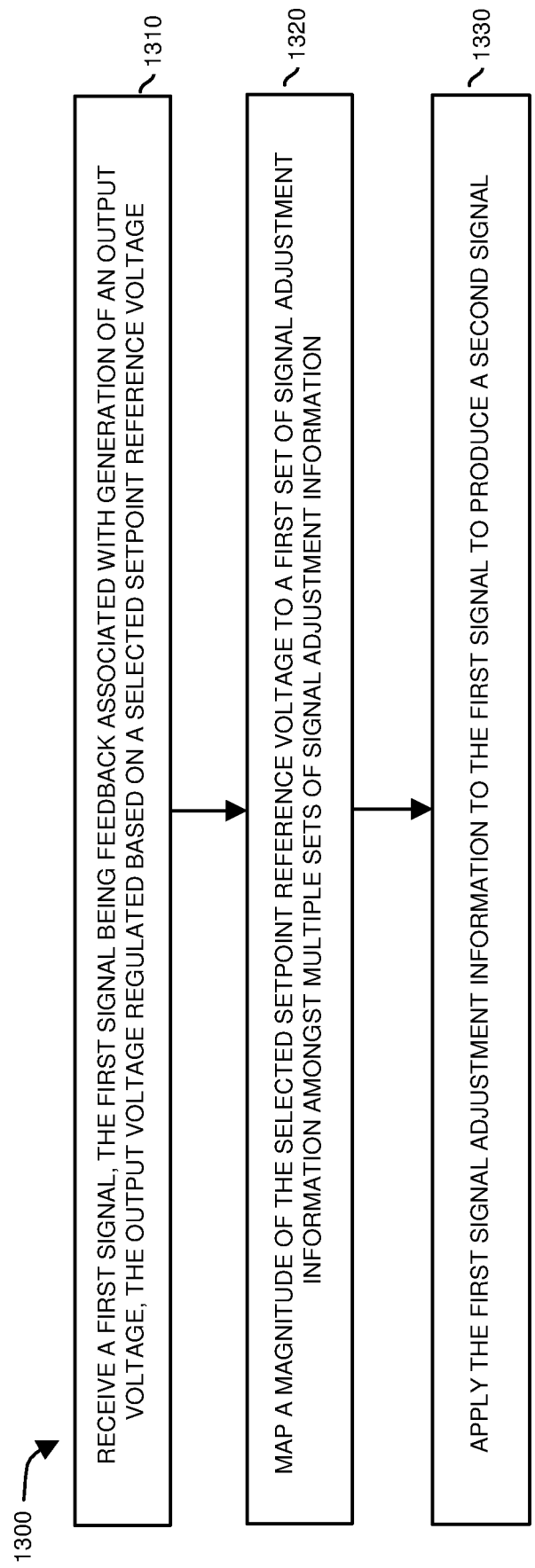
FIG. 13 is an example diagram illustrating a method as discussed herein.

FIG. 13 is an example diagram illustrating a method of providing signal adjustment as discussed herein.

In processing operation 1310, the signal adjustor 140 receives a first signal XX1. The first signal is feedback associated with generation of an output voltage 123. The output voltage 123 is regulated based on a selected setpoint reference voltage (a.k.a., VID setting 376).

In processing operation 1320, the signal adjustor 140 maps a magnitude of the selected setpoint reference voltage (VID setting 376) to a first set of signal adjustment information 120-1 amongst multiple sets of signal adjustment information 120.

In processing operation 1330, the signal adjustor 140 applies the first signal adjustment information to the first signal XX1 to produce a second signal XX1' inputted to the error signal generator (summer 317).

Note again that techniques herein are well suited for use in circuit applications such as those that implement compensation in a power converter. However, it should be noted that techniques herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to the drawings and corresponding description, it will be understood by those skilled in the art that various changes in form and details may be made therein without departing from the spirit and scope of the present application as defined by the appended claims. Such variations are intended to be covered by the scope of this present application. As such, the foregoing description of techniques of the present application is not intended to be limiting. Rather, any limitations to the invention are presented in the following claims.

The invention claimed is:
1. An apparatus comprising
a signal adjustor operative to:
receive a first signal, the first signal being feedback associated with generation of an output voltage, the output voltage regulated based on a selected setpoint reference voltage;

map a magnitude of the selected setpoint reference voltage to a first set of signal adjustment information amongst multiple sets of signal adjustment information; and apply the first set of signal adjustment information to the first signal to produce a second signal.

2. The apparatus as in claim 1, wherein the second signal is an error corrected rendition of the first signal.

3. The apparatus as in claim 1, wherein each of the multiple sets of signal adjustment information is derived during calibration of an analog-to-digital converter operative to produce the first signal.

4. The apparatus as in claim 1, wherein the first signal is received from an analog-to-digital converter disposed in a feedback path of a power converter circuit operative to generate the output voltage.

5. The apparatus as in claim 4, wherein the analog-to-digital converter includes an error sense tracking and compensation loop operative to:

generate the first signal based on a magnitude of the output voltage.

6. The apparatus as in claim 1 further comprising:

an error signal generator operative to receive the setpoint reference voltage and the second signal; and generate an error signal based on a difference between the second signal and the selected setpoint reference voltage.

7. The apparatus as in claim 1, wherein the signal adjustor is further operative to:

for a first instant of time:

determine a first voltage range amongst multiple voltage ranges in which the magnitude of a first instance of the selected setpoint reference voltage falls, the first set of signal adjustment information assigned to the first voltage range; and apply the first set of signal adjustment information to the first signal to produce the second signal.

8. The apparatus as in claim 7, wherein the signal adjustor is further operative to:

for a second instant of time subsequent to the first instant of time:

determine a second voltage range amongst the multiple voltage ranges in which the magnitude of a second instant of the selected setpoint reference voltage falls, a second set of signal adjustment information assigned to the second voltage range; and apply the second set of signal adjustment information to the first signal to produce the second signal.

9. The apparatus as in claim 1, wherein each of the multiple sets of signal adjustment information is assigned a respective voltage range of the setpoint reference voltage.

10. The apparatus as in claim 9, wherein the respective voltage ranges overlap with each other.

11. The apparatus as in claim 1, wherein the first signal is received from an analog-to-digital converter operative to convert the output voltage into the first signal, the first signal being a digital value; and wherein the second signal is a digital value whose magnitude is substantially equal to a magnitude of the output voltage.

12. The apparatus as in claim 1, wherein the multiple sets of signal adjustment information include the first set of signal adjustment information and a second set of signal adjustment information;

wherein the first set of signal adjustment information includes a first gain adjustment value derived from a first slope of a first error signal for a first voltage range, the first error signal obtained during calibration of circuitry producing the first signal for the first voltage range; and wherein the second set of signal adjustment information includes a second gain adjustment value derived from a second slope of a second error signal for a second voltage range, the second error signal obtained during calibration of the circuitry producing the second signal for the second voltage range.

13. The apparatus as in claim 12, wherein the first error signal is non-linear; and wherein the second error signal is non-linear.

14. The apparatus as in claim 1, wherein the multiple sets of signal adjustment information include the first set of signal adjustment information and a second set of signal adjustment information;

wherein the first set of signal adjustment information is assigned to a first range of settings associated with the setpoint reference voltage; and wherein the set of second signal adjustment information is assigned to a second range of settings associated with the setpoint reference voltage.

15. The apparatus as in claim 1, wherein the signal adjustor is disposed in a circuit path between a digital-to-analog converter operative to produce the first signal and an error signal generator operative to receive the second signal.

16. The apparatus as in claim 1, wherein the signal adjustor includes a gain stage;

wherein the first set of signal adjustment information includes a first gain value; and wherein application of the first set of signal adjustment information to the first signal includes, via the gain stage, application of the first gain value to the first signal.

17. The apparatus as in claim 1, wherein the signal adjustor includes a gain stage and an offset stage;

wherein the first set of signal adjustment information includes a first gain value and a first offset value; and wherein application of the first set of signal adjustment information to the first signal includes: i) application of the first gain value to produce an intermediate signal, and ii) application of the first offset value to the intermediate signal to produce the second signal.

18. The apparatus as in claim 1, wherein the multiple sets of signal adjustment information include:

the first set of signal adjustment information; and a second set of signal adjustment information.

19. The apparatus as in claim 18, wherein the first set of signal adjustment information is assigned a first voltage range; and wherein the second set of signal adjustment information is assigned a second voltage range.

20. The apparatus as in claim 19, wherein the first set of signal adjustment information includes a first gain value and a first offset value to apply to the first signal during conditions in which a magnitude of the setpoint reference voltage falls in the first voltage range; and wherein the second set of signal adjustment information includes a second gain value and a second offset value to apply to the first signal during conditions in which the magnitude of the setpoint reference voltage falls in the second voltage range.

21. A method comprising:

receiving a first signal, the first signal being feedback associated with generation of an output voltage with respect to a selected setpoint reference voltage;

mapping a magnitude of the selected setpoint reference voltage to a first set of signal adjustment information amongst multiple sets of signal adjustment information; and applying the first set of signal adjustment information to the first signal to produce a second signal.

22. The method as in claim 21, wherein the first signal is received from an analog-to-digital converter disposed in a feedback path of a power converter, the power converter operative to generate the output voltage.

23. The method as in claim 22 further comprising:

via an error sense tracking and compensation loop of the analog-to-digital converter, generating the first signal based on a magnitude of the output voltage.

24. The method as in claim 21, wherein the multiple sets of signal adjustment information include the first set of signal adjustment information and a second set of signal adjustment information;

wherein the first set of signal adjustment information is assigned to a first range of settings associated with the setpoint reference voltage; and wherein the set of second signal adjustment information is assigned to a second range of settings associated with the setpoint reference voltage.

25. The method as in claim 24 further comprising:

applying the first set of signal adjustment information to the first signal to produce the second signal in response to detecting that the selected magnitude of the setpoint reference voltage falls within the first range.

26. The method as in claim 25, wherein the first set of signal adjustment information includes a first gain value and a first offset value; and wherein applying the first set of signal adjustment information to the first signal to produce the second signal includes: applying a combination of the first gain value and the first offset value to the first signal to produce the second signal.

27. The method as in claim 21, wherein the multiple sets of signal adjustment information include the first set of signal adjustment information and a second set of signal adjustment information;

wherein the first set of signal adjustment information includes a first gain adjustment value derived from a first slope of a first error signal for a first voltage range, the first error signal obtained during calibration of circuitry producing the first signal for the first voltage range; and wherein the second set of signal adjustment information includes a second gain adjustment value derived from a second slope of a second error signal for a second voltage range, the second error signal obtained during calibration of the circuitry producing the second signal for the second voltage range.

28. The method as in claim 21, wherein the first set of signal adjustment information includes a first gain value; and wherein applying the first set of signal adjustment information to the first signal to produce the second signal includes, via a gain stage, applying the first gain value to the first signal.

29. The method as in claim 21, wherein the first set of signal adjustment information includes a first gain value and a first offset value; and wherein applying the first set of signal adjustment information to the first signal to produce the second signal includes: i) applying the first gain value to produce an intermediate signal, and ii) applying the first offset value to the intermediate signal to produce the second signal.

30. The method as in claim 21, wherein the multiple sets of signal adjustment information include: i) the first set of signal adjustment information assigned a first voltage range, and ii) a second set of signal adjustment information assigned a second voltage range;

wherein the first set of signal adjustment information includes a first gain value and a first offset value to apply to the first signal during conditions in which the magnitude of the setpoint reference voltage falls in the first voltage range; and wherein the second set of signal adjustment information includes a second gain value and a second offset value to apply to the first signal during conditions in which the magnitude of the setpoint reference voltage falls in the second voltage range.

* * * * *